United States Patent [19]

Tomita et al.

[11] 3,835,401

[45] Sept. 10, 1974

[54] SIGNAL CONTROL CIRCUIT

[75] Inventors: Masao Tomita; Kiyoji Fujisawa; Takashi Miura, all of Osaka, Japan

[73] Assignee: Matsushita Electric Industrial Co., Ltd., Osaka, Japan

[22] Filed: Jan. 26, 1973

[21] Appl. No.: 326,696

[30] Foreign Application Priority Data

| | | |
|---|---|---|
| Feb. 1, 1972 | Japan | 47-011658 |
| Feb. 8, 1972 | Japan | 47-014255 |
| Feb. 8, 1972 | Japan | 47-014256 |

[52] U.S. Cl. .................. 328/172, 307/237, 328/162, 328/165, 328/171, 330/145

[51] Int. Cl. ......... H03f 1/32, H03g 3/20, H03k 5/08

[58] Field of Search ............ 307/237, 264; 328/162, 328/165, 168, 169, 171, 172, 173; 330/29, 144, 145

[56] References Cited

UNITED STATES PATENTS

| | | | |
|---|---|---|---|
| 2,935,625 | 5/1960 | Schayes | 307/237 |
| 3,117,287 | 1/1964 | Damico | 330/29 X |
| 3,246,080 | 4/1966 | Ritchey, Jr. | 328/168 X |
| 3,365,670 | 1/1968 | Sheffet | 328/171 X |
| 3,449,684 | 6/1969 | Kagan | 330/145 X |
| 3,465,171 | 9/1969 | Moses | 328/171 X |
| 3,538,347 | 11/1970 | Spotts | 307/264 X |
| 3,569,852 | 3/1971 | Berkovits | 330/29 X |
| 3,621,284 | 11/1971 | Cluett et al. | 307/264 X |
| 3,665,345 | 5/1972 | Dolby | 307/237 X |
| 3,725,800 | 4/1973 | Papay | 330/145 X |

*Primary Examiner*—Rudolph V. Rolinec
*Assistant Examiner*—L. N. Anagnos
*Attorney, Agent, or Firm*—Wenderoth, Lind & Ponack

[57] ABSTRACT

A signal control circuit has two transistors. The collector and the emitter of the first transistor are connected to the emitter and the collector of the other transistor, respectively, and the bases of the two transistors are grounded. The amplitude of a signal applied to the junction of the collector of the first transistor and the emitter of the other transistor through a resistor and a capacitor from an input terminal is controlled according to a control signal applied to the junction of the bases of the two transistors.

17 Claims, 9 Drawing Figures

SIGNAL CONTROL CIRCUIT

FIELD OF THE INVENTION

This invention relates to a signal control circuit, and more particularly relates to an improved signal control circuit which is used as a variable impedance device.

DESCRIPTION OF THE PRIOR ART

Usually, in an electronic device such as a tape recorder, there is used a signal control circuit such as a volume compressor, a volume expander and an automatic gain control system In such a signal control system, the amplitude of an alternating signal is controlled according to a control signal.

Up to present, several methods have been developed for controlling the amplitude of signals. These methods are classified into two basic types, i.e., one method using a transistor amplifier, the gain of which varies according to the operation point, and the other method using elements such as diodes or transistors which provide the different constants according to the operation point for one element of a signal attenuator. As an example of the first type, there is an automatic gain control amplifier in which the base bias voltage of the first stage transistor varies according to the rectified voltage of the output signal. However, such a signal control circuit has several disadvantages. That is, when low gain is needed, because the transistor is operated near the cut off condition, a large harmonic distortion is apt to appear in the output signal. Furthermore, the amplifier becomes very unstable because the base bias voltage always changes with variation in the input signal amplitude.

As an example of the second type, there is a variable attenuator which comprises a fixed resistor and a series circuit of two diodes as a variable impedance element. However, such a variable attenuator also has several disadvantages. That is, when the control signal varies suddenly, there is caused so-called thump, i.e., undesirable noise appearing in the output signal owing to the change of the control signal. Further, a large amount of electric power is required for the control signal since it is necessary to supply the control current directly into the diodes. There is another type of variable attenuator which uses the resistance between collector and emitter of a transistor for a variable impedance element. However, such a variable attenuator also has disadvantages. That is, because the minimum value of that resistance usually depends on the size of the transistor chip, it is difficult to get a very small saturation resistance in a small signal transistor, especially for a monolithic integrated circuit which contains many elements mounted on a chip. As a result, it becomes impossible to obtain a wide control region in the variable attenuator. Moreover, because the characteristic of the voltage $V_{CE}$ between the collector and emitter versus the collector current $I_C$ at the small signal region in the transistor operation is not exactly linear, there is caused harmonic distortion.

BRIEF SUMMARY OF THE INVENTION

Therefore, an object of the present invention is to provide an improved signal control circuit which controls the amplitude of alternating signals. Another object of the invention is to provide a signal control circuit which has very low harmonic distortion and a wide control range for a variable attenuator. A further object of the invention is to provide a signal control circuit which does not cause thump, the noise owing to the sudden change in the control signal, and does not require a large amount of electric power for the control signal. A further object of the invention is to provide a signal control circuit which can be controlled by a low control voltage. A further object of the invention is to provide a signal control circuit, the gain of which is controlled according to the amplitude of the input signal. A further object of the invention is to provide a signal control circuit in which the amplitude of the output signal is held to a constant amplitude.

These objects are achieved by providing a signal control circuit according to the present invention, which comprises two electron conducting devices and first and second terminals, each of said devices having a first electrode, a second electrode and a third electrode, respectively, and said first and second terminals being provided with a signal to be controlled, said first terminal being a junction point of said first electrode of said first electron conducting device and said second electrode of said second electron conducting device and said second terminal being a junction point of said second electrode of said first electron conducting device and said first electrode of said second electron conducting device, and said third electrodes of said first and second electron conducting devices being provided with the control signal from a control signal source, the signal source for the signal to be controlled being connected to said second terminal, whereby the amplitude of said signal to be controlled applied between said terminals is controlled in accordance with a control signal applied to said third electrodes.

BRIEF DESCRIPTION OF THE DRAWINGS

These and other objects of the invention will be apparent from a consideration of the following detailed description with reference to the accompanying drawings in which.

DETAILED DESCRIPTION OF THE EMBODIMENT

Figure 1:
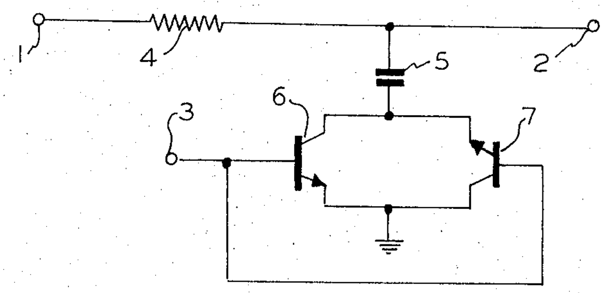
FIG. 1 is a circuit diagram of the basic signal control circuit according to the present invention.

Referring to FIG. 1, there is shown a circuit diagram of the basic signal control circuit of the invention which comprises an input terminal 1, an output terminal 2, a control terminal 3, and a resistor 4 which is connected between the input terminal 1 and the output terminal 2. The output terminal 2 is connected to the junction point of the first electrode of a first electron conducting device which in this embodiment is the collector of a transistor 6 and the second electrode of a second electron conducting device, which in this embodiment is the emitter of a second transistor 7 through a capacitor 5. The emitter of the transistor 6 and the collector of the transistor 7 are commonly grounded. The bases of the transistors 6 and 7 are commonly connected to the control terminal 3.

The variable attenuator consists of the resistor 4, the capacitor 5 and the transistors 6 and 7. The alternating input signal, which is the signal to be controlled, is supplied across the input terminal 1 and the ground. The control signal applied to the control terminal 3 is supplied to the bases of the transistors 6 and 7. The small signal resistance between collector and emitter of the transistors 6 and 7 is varied according to the control signal, and the amount of attenuation of the variable attenuator is varied according to the resistance of the transistors 6 and 7. Therefore, the amplitude of the input signal is controlled in response to the control signal, and the controlled output signal appears at the output terminal 2. In this configuration, the capacitor 5 is used for stopping the direct current signal, and the impedance of the capacitor 5 is chosen so that it is sufficiently small compared with the saturation resistance of the transistors 6 and 7. This signal control circuit utilizes the transistor characteristic that the small signal resistance between the collector and emitter of the transistor can be controlled in response to the base current thereof.

Figure 2:
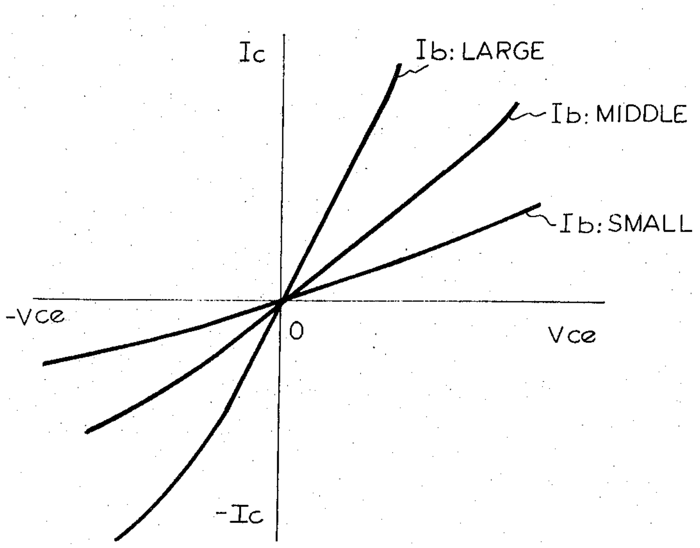
FIG. 2 is graph showing the characteristics of the transistor in the small signal region for explaining the operation of the signal control circuit of the invention.

Generally, the $V_{CE}$ v.s. $I_C$ characteristics (the characteristics of the voltage $V_{CE}$ between the collector and emitter versus the collector current $I_C$) in the small signal region is non-linear as shown in FIG. 2. If only one transistor is used in the variable attenuator, that is, if the transistor 7 in FIG. 1 is not included, such a system will of course generate non-linear distortion. This nonlinear distortion originates from the fact that the $V_{CE}$ v.s. $I_C$ characteristic in the first quadrant is different from that in the third quadrant. The component of distortion caused by the nonlinear characteristics is mainly second harmonics.

However, the configuration according to the present invention as shown in FIG. 1 can cancel the even order harmonics generated in each transistor, and so the nonlinear distortion can be decreased remarkably. Now, consider that a sine wave signal is applied to the input terminal 1. During the period of the positive half wave, the transistor 6 operates in the first quadrant of $V_{CE}$ v.s. $I_C$ characteristic shown in FIG. 2. However, because the collector and emitter of the transistor 7 are connected reversely to the corresponding electrodes of the transistor 6, the transistor 7 operates in the third quadrant. During the period of the negative half wave, the transistor 6 operates in the third quadrant and the transistor 7 operates in the first quadrant. If the transistors 6 and 7 have characteristics which are identical to each other, the composite characteristics become symmetric with respect to the origin, and even order harmonics are not caused. Accordingly, the second harmonics are cancelled perfectly and the nonlinear distortion is decreased remarkably.

In a monolithic integrated circuit, it is easy to get some transistors having the same characteristics as each other since transistors of the same structure can be formed at closely adjacent positions on a chip. Therefore, the circuit according to the invention is suitable especially for monolithic integrated circuits. Furthermore, the present embodiment shown in FIG. 1 uses the parallel compound resistance of the transistors 6 and 7 for the variable resistance circuit, so that the minimum resistance of the variable resistance circuit is half of that of one transistor. As a result, it becomes possible obtain a the wide control range.

Generally, the $V_{CE}$ v.s. $I_C$ characteristic passes near the origin for any base current as shown in FIG. 2 so that thump is not caused in the output signal although the control signal varies suddenly.

Figure 3:
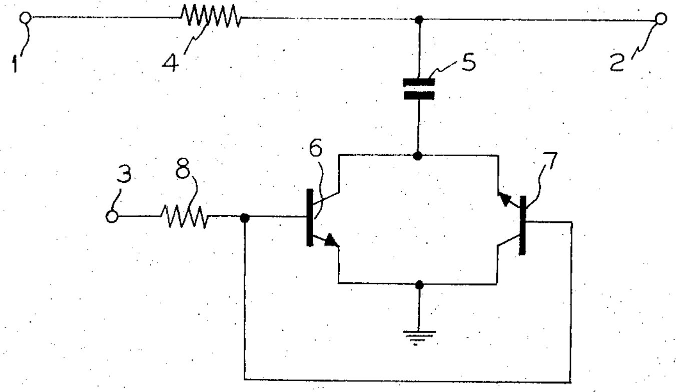
FIG. 3 is a circuit diagram of another signal control circuit according to the present invention.

The circuit shown in FIG. 3 is another embodiment of the invention. It is different from the circuit in FIG. 1 in that a resistor 8 is connected between the control terminal 3 and the bases of the transistors 6 and 7. The resistance of the resistor 8 is given a large value so that the bases of the transistors 6 and 7 are driven as though by constant current, and this is very effective for decreasing the nonlinear distortion.

Figure 4:
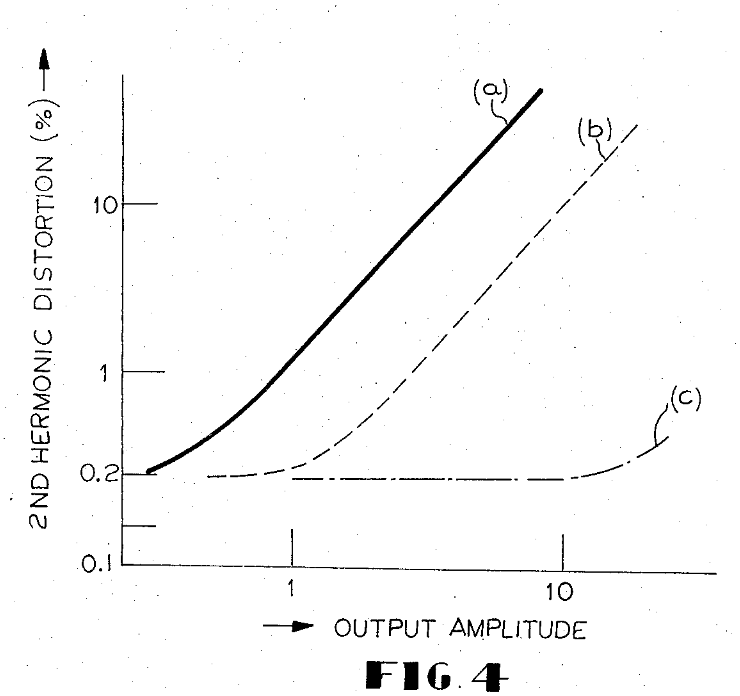
FIG. 4 is graph showing characteristics of the second harmonic distortion in the signal control systems for explaining the operation of the circuit of the invention.

FIG. 4 illustrates the characteristics of the second harmonic distortion based on results of experiments, wherein the vertical axis is the ratio of the second harmonics relative to the fundamental component, and the horizontal axis is the amplitude of the output signal, that is, the amplitude across the variable resistance. The curve *a* is the characteristic for the case when only one transistor is used for a variable resistance. In this case, the second harmonic distortion is proportional to the amplitude of the signal applied between the collector and emitter of the transistor used for a variable resistance. The curve *b* is the characteristic for the case when the control terminal is driven by a form of constant voltage as shown in the embodiment of FIG. 1. It is seen that the second harmonic distortion decreases compared with the curve *a* although it is not completely cancelled. The curve *c* is the characteristic for the case when the control terminal is drived by a form of constant current as shown in the embodiment of FIG. 3. In this case, it is seen that the second harmonics are cancelled almost completely, since 0.2 percent is the noise level for the measuring instrument.

Figure 5:
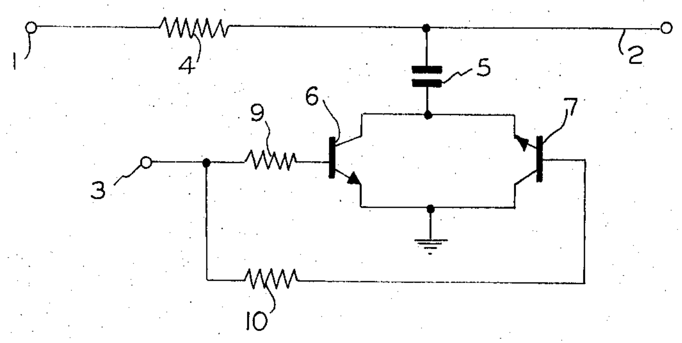
FIG. 5 is a circuit diagram of still another signal control circuit according to the present invention.

The circuit shown in FIG. 5 is an embodiment of the invention which is suitable when the two transistors forming the variable resistance have different characteristics from each other. FIG. 5 is the same as the circuit shown in FIG. 1 except that resistors 9 and 10 are connected between the control terminal 3 and the bases of the transistors 6 and 7, respectively. According to this configuration, even when the characteristics of the transistors 6 and 7 are not identical to each other, it is possible to adjust the circuit so that the harmonic distortion becomes a minimum value by selecting suitable resistances for the resistors 9 and 10.

Figure 6:
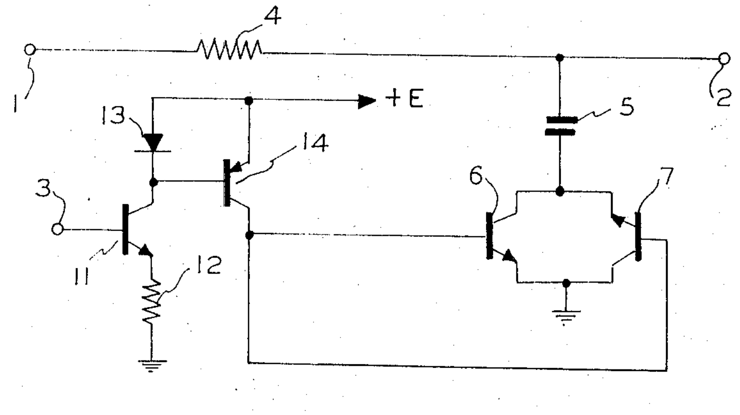
FIG. 6 is a circuit diagram of still another signal control circuit according to the present invention.

The circuit shown in FIG. 6 is another embodiment of the invention. The method of supplying the base current for the transistors 6 and 7 is different from that of the circuit shown in FIG. 3. That is, the control terminal 3 is connected to the base of a transistor 11. The emitter of the transistor 11 is grounded through an emitter resistance 12 and the collector is connected to a separate DC source +E through a diode 13. The collector of the transistor 11 is also connected to the base of another transistor 14 which is a PNP transistor. The emitter of the transistor 14 is connected to the separate D. C. source +E and the collector is connected to the bases of the transistors 6 and 7. In FIG. 6, the control signal is applied to the base of transistor 11 from the control terminal 3 and there is provided a collector current. The amplitude of that collector current is determined according to the control voltage, the voltage between the base and emitter of the transistor 11 and the resistance of the resistor 12. Therefore, this collector current is proportional to the control voltage, since the voltage between the base and emitter of the transistor 11 has a constant value and the resistance of the resistor 12 is fixed. Depending on the collector current, a voltage appears across the diode 13. The base and emitter of the PNP transistor 14 are connected across the diode 13.

The collector current of the transistor 14 is proportional to the collector current of the transistor 11. If the diode 13 and the junction of the base-emitter electrodes of the transistor 14 have identical characteristics to each other, the collector current of the transistor 14 becomes almost equal to that of the transistor 11. As a result, the base current of the transistors 6 and 7 is proportional to the control signal, and so the amount of attenuation of the variable attenuator is controlled according to the control signal.

A special merit of this configuration is that the second harmonic distortion is cancelled out almost completely, because the output impedance of the collector of the transistor 14 is very large and the bases of the transistors 6 and 7 are driven by a constant current. A further special merit is that the attenuation can be controlled by a low power control signal, because the input impedance at the control terminal 3 is large since the transistor 11 has the emitter resistor 12. Furthermore, the control signal is not required to have a high voltage, because the transistor 11 operates if as little as 0.7 volt is supplied to the base thereof.

Figure 7:
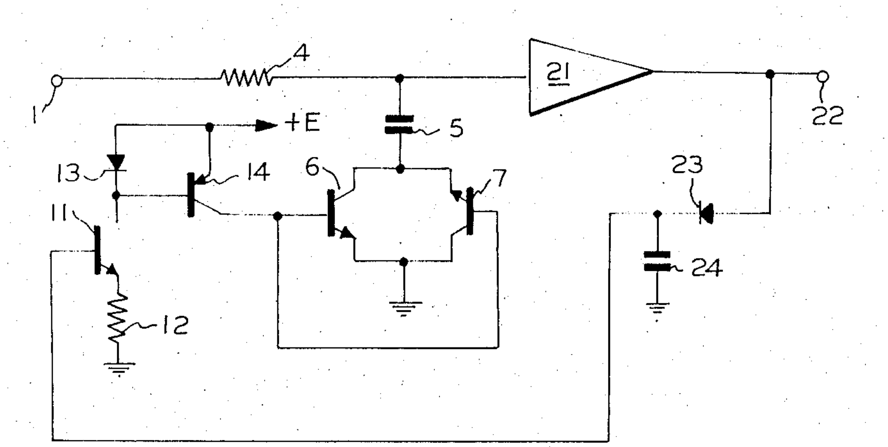
FIG. 7 is a circuit diagram of an automatic gain control circuit according to the present invention.

The system of FIG. 7 is an embodiment of the invention in which the circuit shown in FIG. 6 is applied to an automatic gain control system for an audio frequency band. Referring to FIG. 7, the input signal applied at the input terminal 1 is controlled by the variable attenuator which is formed by the resistor 4, capacitor 5 and transistors 6 and 7. The signal controlled by the variable attenuator is amplified by an amplifier 21 and appears at an output terminal 22. The output signal is rectified by a rectifier circuit formed by a diode 23 and a capacitor 24, and the rectified signal is fed to the base of the transistor 11 which forms the constant current circuit together with the resistor 12, diode 13 and transistor 14.

In this configuration, when the input signal increases, the output signal of the amplifier 21 increases and the DC control voltage rectified by the diode 23 and capacitor 24 also increases. Accordingly, the base current of the transistors 6 and 7 increases which increases the attenuation of the variable attenuator. As a result, the amplitude of the output signal is held to a constant value. This automatic gain control system has many features. One of them is that the second harmonic distortion is very small as described hereinbefore. Another one is that a wide control range in an automatic gain control system is provided because the two transistors are connected in parallel as the variable resistance. Further, it is possible to obtain a sufficiently long recovery time for the automatic gain control action. Because the recovery time is the time for the discharge of rectified voltage across the capacitor 24 in this case, it becomes long enough since the input impedance at the base of the transistor 11 is very large. The long recovery time is very suitable for a tape recorder. Furthermore, the automatic gain control system can be driven by the low control voltage and the small control power as described in the above for the embodiment of FIG. 6.

Figure 8:
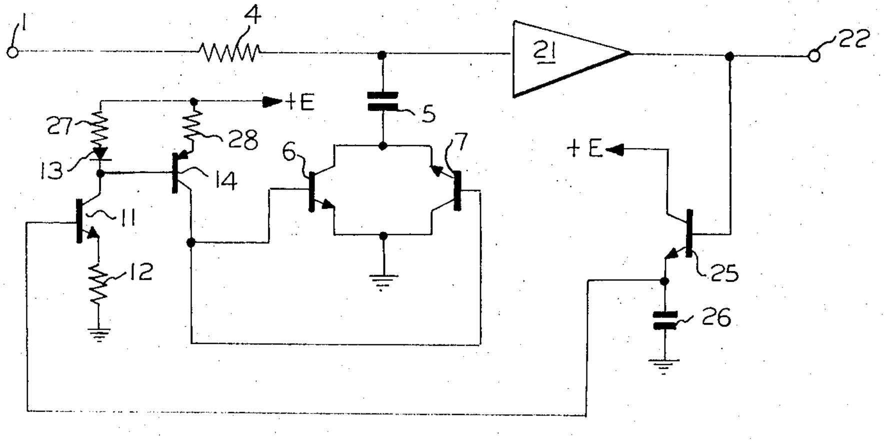
FIG. 8 is a circuit diagram of another automatic gain control circuit according to the present invention.

The system of FIG. 8 is another embodiment of the automatic gain control system of the invention. This system has two differences from the embodiment in FIG. 7. One of them is that the rectifier circuit consists of a transistor 25 and a capacitor 26. The smoothing capacitor 26 is connected to the emitter of the transistor 25 so that the charge time of the capacitor 26 is short. As described above, the attack time in the automatic gain control action can be set to be shorter than that of the embodiment in FIG. 7. Another different point is that resistors 27 and 28 are inserted in the constant current circuit. Even when the diode 13 and the base-emitter junction of the transistor 14 have different characteristics from each other, it is possible to adjust the collector current of the transistor 14 by properly selecting the resistances of these resistors 27 and 28.

Figure 9:
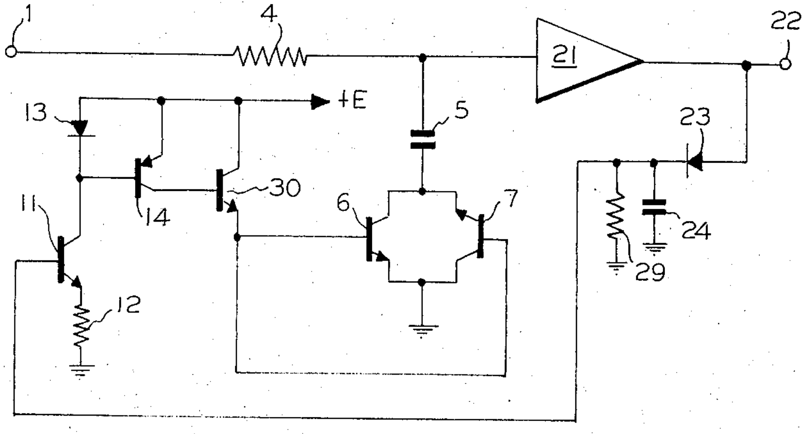
FIG. 9 is a circuit diagram of still another automatic gain control circuit according to the present invention.

The system of FIG. 9 is another embodiment of the automatic gain control system of the invention. This system is different in two ways from the embodiment in FIG. 7. First a resistor 29 is added in parallel to the capacitor 24 in the rectifier circuit. In this case, the recovery time, that is, the discharge time of the capacitor 24 is determined by the resistance of the resistor 29 and the capacitance of the capacitor 24. Therefore, the recovery time can be freely set by selecting an appropriate resistance of the resistor 29. Of course, this arrangement can be used in the embodiment in FIG. 8. That is, a resistor can be connected in parallel with the capacitor 26 so as to freely set the recovery time. Second a transistor 30 is added in the constant current circuit. The transistor 30 is connected in a complementary connection with the transistor 14, and so the equivalent current gain of the PNP transistor 14 can be increased. Accordingly, it is suitable to use this configuration when the PNP transistor has a small current gain.

There is described hereinbefore preferred embodiments of the invention, and it is apparent that various modifications may be made without departing from the spirit and scope of the invention which is defined by the following claims.

What is claimed is:

1. A signal control circuit comprising two electron conducting devices and first and second terminals, each of said devices having a first electrode, a second electrode and a third electrode, respectively, said first electrode of said first electron conducting device being connected to said second electrode of said second electron conducting device to form said first terminal and said second electrode of said first electron conducting device and said first electrode of said second electron conducting device being connected to form said second terminal, and a control signal input means being connected to said third electrodes of said first and second electron conducting devices for supplying a control signal from a control signal source to said third electrode, and an input signal means, being coupled to said first and second terminals, whereby the amplitude of said input signal applied to said terminals is controlled in accordance with a control signal applied to said third electrodes.

2. A signal control circuit as claimed in claim 1, wherein said first and second electron conducting device are transistors.

3. A signal control circuit as claimed in claim 1, wherein said first and second electron conducting devices are transistors having the same characteristics.

4. A signal control circuit as claimed in claim 1, wherein said electron conducting devices are first and second transistors and said first electrodes are collectors of the first and second transistors, and said second electrodes are emitters of said first and second transistors, and said third electrodes are bases of said first and second transistors.

5. A signal control circuit as claimed in claim 4, wherein said base electrodes of said first and second transistors are connected to each other.

6. A signal control circuit as claimed in claim 4, in which said input signal means is an input terminal, said circuit further comprising an output terminal, a resistor which is connected between said input and output terminals and a capacitor which is connected between said output terminal and said first terminal, said second terminal of said transistors being grounded and said bases of said first and second transistors being connected to each other.

7. A signal control circuit as claimed in claim 6, in which said control signal input means comprises a constant current circuit which is coupled to said bases of said first and second transistors.

8. A signal control circuit as claimed in claim 7, wherein said constant current circuit includes a resistor.

9. A signal control circuit as claimed in claim 7, wherein said constant current circuit comprises a diode, a resistor, a third transistor, and a fourth transistor, a direct current voltage source to which the emitter of said third transistor is connected, the collector of said third transistor being connected to said bases of said first and second transistors, said diode being connected between the base and emitter of said third transistor, the collector of said fourth transistor being connected to the base of said third transistor, the emitter of said fourth transistor being grounded through said resistor, and the base of said fourth transistor being a control signal input terminal.

10. A signal control circuit as claimed in claim 4, in which said input signal means is an input terminal, said circuit further comprising an output terminal, a resistor connected between said input and output terminals and a capacitor which is connected between said output terminal and said first terminal, said second terminal of said transistors being grounded, and a resistor through which said bases of said first and second transistors are coupled to said control signal input means, respectively.

11. A signal control circuit comprising: an input terminal; an output terminal; a variable resistance circuit means which comprises at least first and second transistors, the collector of said first transistor being connected to the emitter of said second transistor, the emitter of said first transistor being connected to the collector of said second transistor and the junction point of said emitter of said first transistor and said collector of said second transistor being grounded, and bases of said first and second transistors being connected to each other; a constant current circuit means coupled to said variable resistance circuit for supplying a control current to said bases of said transistors; an amplifier means having an input and output terminal; a rectifier means coupled to said output terminal of said amplifier means and to said constant current circuit means for receiving said amplified signal and supplying a control signal to said constant current circuit means; an input resistance means connected between said input terminal and the input terminal of said amplifier means; and a capacitance means connected between said input terminal of said amplifier means and the junction of said collector of said first transistor and said emitter of said second transistor of said variable resistance circuit means.

12. A signal control circuit as claimed in claim 11, wherein said constant current circuit means is a resistor.

13. A signal control circuit as claimed in claim 11, wherein said constant current circuit means comprises a diode, a resistor, a third transistor, and a fourth transistor, a direct current voltage source to which the emitter of said third transistor is connected, the collector of said third transistor being connected to said bases of said first and second transistors, said diode being connected between the base and emitter of said third transistor, the collector of said fourth transistor being connected to the base of said third transistor, the emitter of said fourth transistor being grounded through said resistor, and the base of said fourth transistor being a control signal input terminal.

14. A signal control circuit as claimed in claim 13, further including two further resistors, one of said further resistors being connected between said emitter of said third transistor and said direct current voltage source, and the other further resistor being connected between one end of said diode and said direct current voltage source.

15. A signal control circuit as claimed in claim 13, further including a fifth transistor having the base connected to the collector of said third transistor, the collector connected to said direct current voltage source, and the emitter connected to said bases of said first and second transistors.

16. A signal control circuit as claimed in claim 13, wherein said rectifier means comprising a rectifying transistor, the collector of said rectifying transistor being connected to said direct current source, and a rectifying capacitor which is connected between the emitter of said rectifying transistor and ground.

17. A signal control circuit as claimed in claim 13, wherein said rectifier means comprises a rectifying diode and a parallel connection of a rectifying capacitor and a rectifying resistor.

* * * * *